US005627841A

United States Patent [19]
Nakamura

[11] Patent Number: 5,627,841
[45] Date of Patent: May 6, 1997

[54] INTEGRATED LOGIC CIRCUIT WITH PARTIAL SCAN PATH CIRCUIT AND PARTIAL SCAN PATH DESIGN METHOD FOR SAME

[75] Inventor: Yoshiyuki Nakamura, Tokyo, Japan

[73] Assignee: NEC Corporation, Tokyo, Japan

[21] Appl. No.: 538,228

[22] Filed: Oct. 3, 1995

[30] Foreign Application Priority Data

Oct. 5, 1994 [JP] Japan .................................. 6-240464

[51] Int. Cl.$^6$ .................................................. G01R 31/28
[52] U.S. Cl. ...................... 371/22.3; 371/22.1; 371/22.5
[58] Field of Search ............................... 371/22.3, 22.5, 371/25.1, 22.1, 22.2; 324/158 R, 73.1

[56] References Cited

U.S. PATENT DOCUMENTS

| | | |
|---|---|---|
| 5,043,986 | 8/1991 | Agrawal et al. . |
| 5,132,974 | 7/1992 | Rosales ............................. 371/22.3 |
| 5,329,533 | 7/1994 | Lin .................................. 371/22.3 |
| 5,519,713 | 5/1996 | Baeg et al. ........................ 371/22.1 |
| 5,519,714 | 5/1996 | Nakamura et al. ............... 371/22.3 |

OTHER PUBLICATIONS

T. Kobayashi et al.; "Adapted Flip–Flop Circuit for FLT"; Collected Papers for the 1968 National Meeting of the Association of Electronic and Communications Engineers of Japan, No. 892; p. 962. 1968.

Primary Examiner—Robert W. Beausoliel, Jr.
Assistant Examiner—Nadeem Iqbal
Attorney, Agent, or Firm—Whitham, Curtis, Whitham & McGinn

[57] ABSTRACT

Among a plurality of flip-flops coupled with a combinational logic and supplied with a plurality of different clocks, a number of flip-flops are selected so that a respective one of the selected flip-flops is supplied with an associated one of the clocks and has an output thereof connected to one or more of the selected flip-flops, of which at least one is supplied with one of the clocks different from the associated clock of the respective one of the selected flip-flops, and are designed as scan flip-flops to be serially connected to constitute a partial scan path circuit.

9 Claims, 13 Drawing Sheets

FIG. 13

INTEGRATED LOGIC CIRCUIT WITH PARTIAL SCAN PATH CIRCUIT AND PARTIAL SCAN PATH DESIGN METHOD FOR SAME

BACKGROUND OF THE INVENTION

The present invention relates generally to an integrated logic circuit on a semiconductor chip and a design method therefor, and particularly, to an integrated logic circuit as a functional circuit composed of a set of various logic circuits (hereafter "combinational logic") and a set of clock-driven flip-flops (hereafter "FFs") combined therewith to exhibit a desired combinational function, in which selected ones of the FFs, smaller in number than a total thereof, are adapted for a serial connection therebetween to constitute a partial (not full) scan path circuit in a test mode of the integrated logic circuit, and to a partial scan path design method for designing a partial scan path circuit on the way to design an integrated logic circuit, where the integrated logic circuit has an arrangement of FFs therein designed as an object circuit of the design method, with necessary functional and clock connections therefor.

DESCRIPTION OF THE RELATED ART

In general, the integrated logic circuit composed of sequential circuits tends to accompany a drastically increased complexity in testing for a fault detection in a fabrication process thereof, as it is large scaled.

To avoid the problem, there was proposed in the art and has been widely applied a full scan path system in which, in a test mode for a fault detection, a total of associated FFs were all connected so as to constitute a shift register for shifting a sequence of sample data.

The scan path system was introduced in a paper on a functional logic test for computer-oriented logic circuits, "Adapted Flip-Flop Circuit for FLT" by T. Kobayashi et al., as No. 892 in the Collected Papers for the 1968's National Meeting of the Association of Electronic and Communications Engineers of Japan, p. 962.

In the scan path system, FFs associated with a combinational logic in an integrated logic circuit were each respectively adapted to be operable in synchronism with a pair of clocks CLK-I and CLK-II so that, on the one hand, the integrated logic circuit was functionable with a pulse of one clock CLK-I applied and, on the other hand, the FFs were connected to work as a shift register with a pulse of the other clock CLK-II applied, thus permitting a fault detection of the FFs to be separated from a fault detection of the combinational logic.

For example, the clock CLK-II was used to perform the former detection in which the FFs were checked for no faults by simply shifting a data therethrough, before the latter detection in which, after an additional use of the CLK-II to set a pattern of serial test data in the FFs, a pulse of the clock CLK-I was applied to have a variety of parallel functional data sampled from the combinational logic by and held in the FFs, before still additional use of the CLK-II to serially read the sampled data, which were then compared with a sequential pattern of reference data.

The scan path system has effectively eliminated a difficulty of a functional logic test, with a penalty of increased in chip area or decreased integrity of logic circuits due to an additional provision of circuitry for a scan path.

To possibly overcome such a drawback, there was proposed a conventional partial scan path design method in the U.S. Pat. No. 5,043,986 to V. D. Agrawal, in which one of an arbitrary number of memory elements such as FFs or latches constituting a feedback loop via a combinational logic path was selected as a scan memory element, with the others left as they were non-scan memory elements, unless the number of memory elements was smaller than a critical number.

Figure 1:
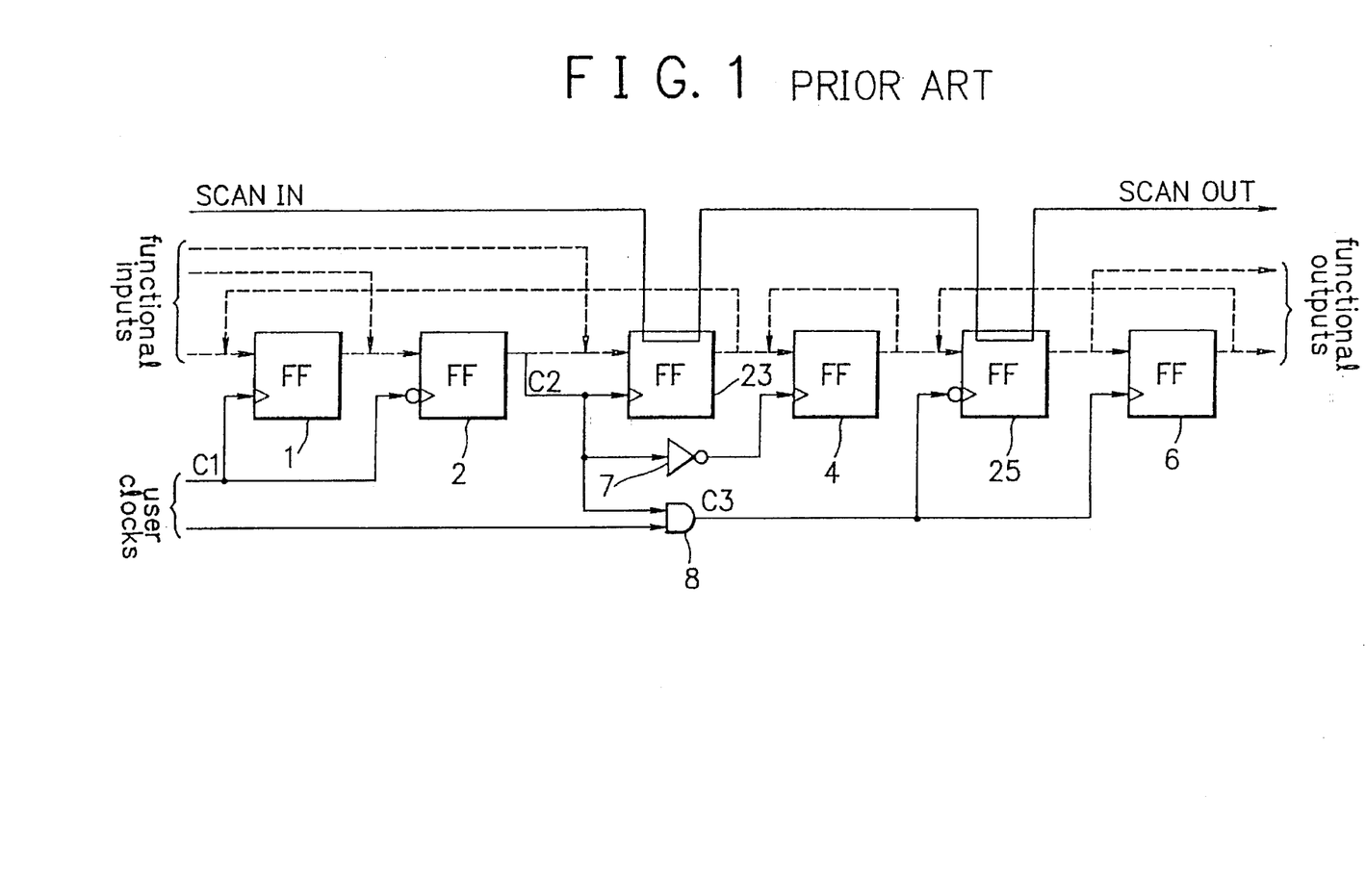
FIG. 1 is a circuit diagram of an essential part of an integrated logic circuit including a partial scan path circuit exemplary designed by applying a conventional partial scan path design method to an object circuit shown in FIG. 2.
Figure 2:
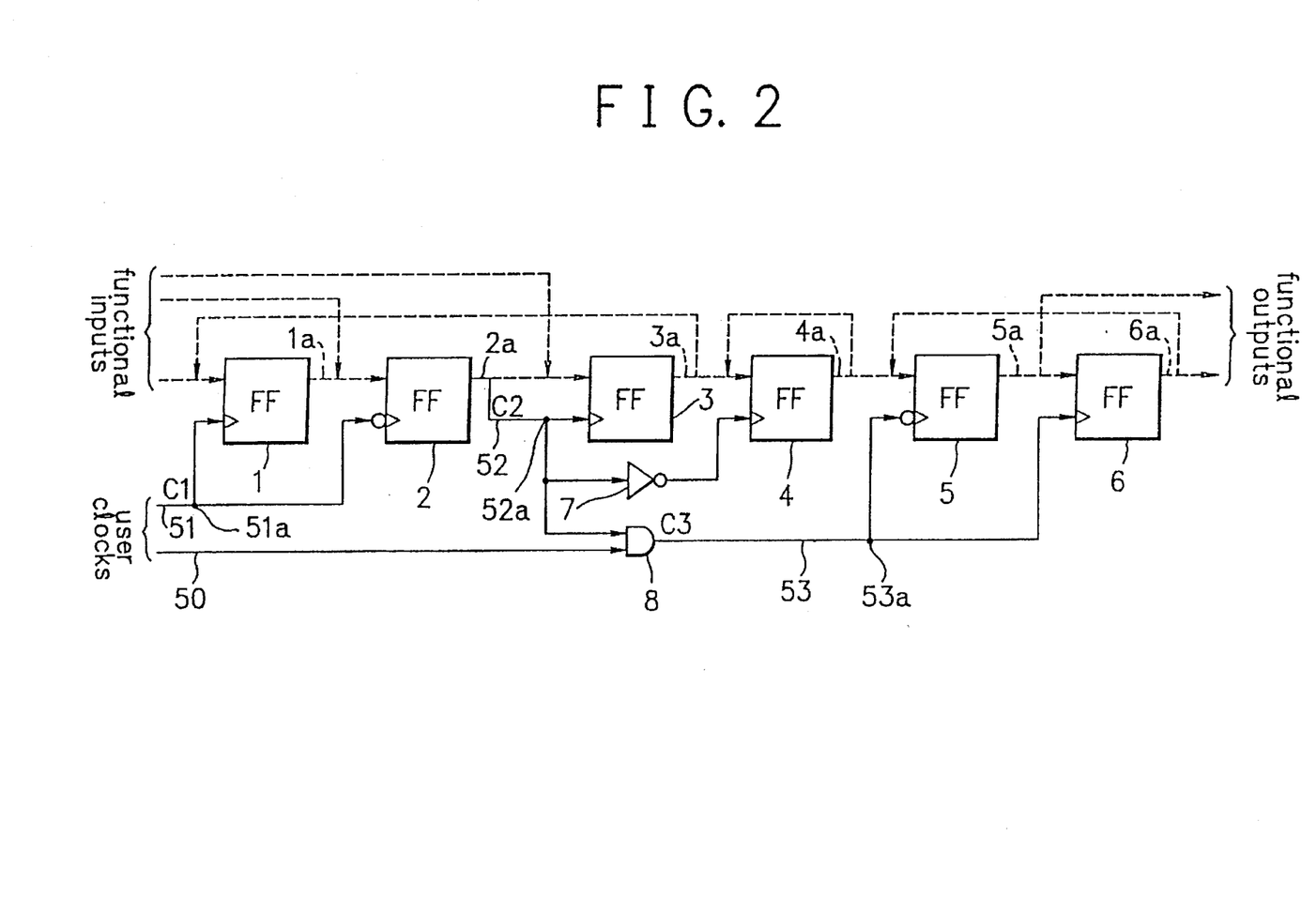
FIG. 2 is a circuit diagram of the object circuit, which is exemplarily provided as a design object, in a form of CAD data set, that is common to both the conventional design method and a partial scan path design method according to an embodiment of the invention.

In this connection, FIG. 1 shows an essential part of an integrated logic circuit including a partial scan path circuit designed by applying the conventional partial scan path design method to an exemplary object circuit shown in FIG. 2.

As shown in FIG. 2, the object circuit has six FFs 1 to 6, in which three FFs 1 to 3, one FF 4 and two FFs 5 and 6 constitute feedback loops, respectively.

Supposing that the critical number =2, the FFs 3 and 5 in FIG. 2 are selected to be designed as scan FFs 23 and 25 in FIG. 1, respectively.

The conventional partial scan path design method thus reduces the number of scan FFs, suppressing an increase of chip area.

Incidentally, recent developments of the integrated logic circuit generally employ a variety of advanced clock systems such as a multi-clock system using a number of different clocks and a gated clock system using an FF or gate for processing a clock signal, to permit an increased operation speed and a reduced chip area.

The conventional partial scan path design method however was provided with no considerations for the multi-clock system or the gated clock system.

Therefore, as will be, seen from the exemplary circuit of FIG. 1 in which an output of the FF2 is employed as a clock for the scan FF 23, it is doubtful if the scan FF 23 could always work to accomplish a desired shift action.

Even if the FF 2 could manage to provide an output so that the scan FF 23 may do for the shift action, a sample data held in the FF2 beforehand might be broken on the way of shift operation, causing a test pattern to be ineffective, resulting in an insufficient fault detection.

The present invention has been achieved with such points in mind.

SUMMARY OF THE INVENTION

It is therefore an object of the present invention to provide an integrated logic circuit including a partial scan path circuit cooperatively functionable even with a multi-clock system or with a gated clock system, permitting an increased operation speed and a reduced chip area.

To achieve the object, an embodiment of the present invention provides an integrated logic circuit comprising a combinational logic, a plurality of FFs coupled with the combinational logic and supplied with a plurality of clock signals, and a partial scan path circuit which comprises a number of selected ones of the FFs of which a respective one is supplied with an associated one of the clock signals and has an output thereof connected to one or more of the selected FFs of which at least one is supplied with one of the clock signals different from the associated clock signal of the respective one of the selected FFs, serial connections for serially connecting the selected FFs, and a scan clock supply circuit for supplying a scan clock to the selected FFs.

According to the invention, the integrated logic circuit further comprises a plurality of gate circuits controlled by a scan sample signal common thereto for controlling the clock signals.

According to the invention, the gate circuits are controlled by the scan sample signal to have a control level fixed at a level preset thereto for a scan action of the selected FFs.

It is another object of the present invention to provide a partial scan path design method for an integrated logic circuit cooperatively functionable even with a multiclock system or with a gated clock system, permitting an increased operation speed and a reduced chip area.

To achieve this object, another embodiment of the present invention provides a partial scan path design method for an integrated logic circuit including a combinational logic and a plurality of FFs coupled therewith and supplied with a plurality of clock signals, the partial scan path design method comprising the steps of selecting a number of the FFs so that a respective one of the selected FFs is supplied with an associated one of the clock signals and has an output thereof connected to one or more of the selected FFs of which at least one is supplied with one of the clock signals different from the associated clock signal of the respective one of the selected FFs, serially connecting the selected FFs, and supplying a scan clock to the selected FFs.

According to this embodiment of the invention, the partial scan path design method further comprises providing a plurality of gate circuits controlled by a scan sample signal common thereto for controlling the clock signals.

According to the invention, therefore, among a plurality of non-scan FFs coupled with a combinational logic, a number of the FFs are selected so that a respective one of the selected FFs is supplied with an associated one of a plurality of clock signals and has an output thereof connected to one or more of the selected FFs of which at least one is supplied with one of the clock signals different from the associated clock signal of the respective one of the selected FFs, and the selected FFs are arranged as scan FFs by providing serial connections therebetween and a scan clock thereto to constitute a partial scan path circuit.

The scan FFs may be provided with a scan-in path and a scan-out path to complete a scan test wiring.

Signal lines for supplying the clock signals to the non-scan and scan FFs are provided with gate circuits for controlling the clock signals. The gate circuits are controlled by a scan sample signal, so that they have their outputs fixed at a preset level to thereby keep the clock signals at a predetermined level in a scan action of the scan FFs.

Accordingly, the partial scan path circuit is free of problems due to a data transfer between FFs supplied with different clock signals, thus permitting a multi-clock system or a gated clock system to be employed therein, effectively decreasing chip area in comparison with a full scan circuit.

BRIEF DESCRIPTION OF THE DRAWINGS

The objects, features and advantages of the present invention will become more apparent from consideration of the following detailed description, taken in conjunction with the accompanying drawings, in which.

DESCRIPTION OF THE PREFERRED EMBODIMENTS

There will be detailed below preferred embodiments of the present invention with reference to the drawings. Like members and items are designated at like reference characters for brevity of the description.

It is now assumed that respective circuit diagrams shown in FIGS. 2–3 and 5–8 are displayed images on a touch-panel type display of an unshown work station that constitutes an unshown computer-aided design (hereafter "CAD") system for designing an integrated logic circuit by using, on the way thereof, a partial scan path design method according to an embodiment of the invention, in which the design method is applied to the object circuit of FIG. 2.

Referring now to FIG. 2, the object circuit comprises an unshown combinational logic provided with a plurality of functional inputs and a plurality of functional outputs, the six FFs 1–6 coupled with the combinational logic so that various combinational logic paths and sequential data paths are established as shown by directional dashed lines, and a clock distribution system shown by directional solid lines.

The clock distribution system includes: a first user clock distribution circuit 50 connected to an input terminal of an AND gate 8; a second user clock distribution circuit 51 connected to a positive-logic clock input terminal of the FF 1 and a negative-logic clock input terminal of the FF 2; a branch circuit 52 for distributing an output of the FF 2 to a positive-logic clock input terminal of the FF 3, an input terminal of an inverter 7 of which an output is connected to a positive-logic input terminal of the FF 4, and another input terminal of the AND gate 8; and a gated clock distribution circuit 53 for distributing an output of the AND gate 8 to a negative-logic input terminal of the FF 5 and a positive-logic input terminal of the FF 6.

Therefore, among the six FFs 1~6 in the object circuit, the FFs 1 and 2 are supplied with a clock C1 from the second user clock distribution circuit 51, the FF 3 with a clock C2 from the branch circuit 52, the FF 4 with an inverted clock of the clock C2, and the FFs 5 and 6 with a clock C3 from the gated clock distribution circuit 53.

The clocks C1 to C3 are different from each other. Namely, the clocks C1, C2 and C3 comprise sequences of a first, a second and a third clock pulse, respectively, that are designed to be different from each other in phase and/or duration, or more specifically in terms of a temporal range of a pulse duration between a rising edge and a falling edge thereof at either side of a neutral level.

In other words, each clock is defined as a temporal sequence of punctual pairs of drive signal means (such as pulse edges) employed either for driving an FF to hold therein a data input thereto and the other for driving the FF to output the data therefrom. The inverted clock of the clock C2 is thus deemed to be equivalent to the clock C2, so long as it concerns a below-described identification of a clock source.

Any such clock is identifiable by designating a collective source thereof that may be a clock supply terminal, a branch node in a clock distribution system or an output terminal of a circuit employed as a clock generator.

In the present embodiment, a branch node 51a in the distribution circuit 51 is selected as a source of the clock C1, by pointing out on the display of the work station. A branch node 52a in the branch circuit 52 is likewise selected as a source of the clock C2, and a branch node 53a in the distribution circuit 53, as a source of the clock C3.

Figure 5:
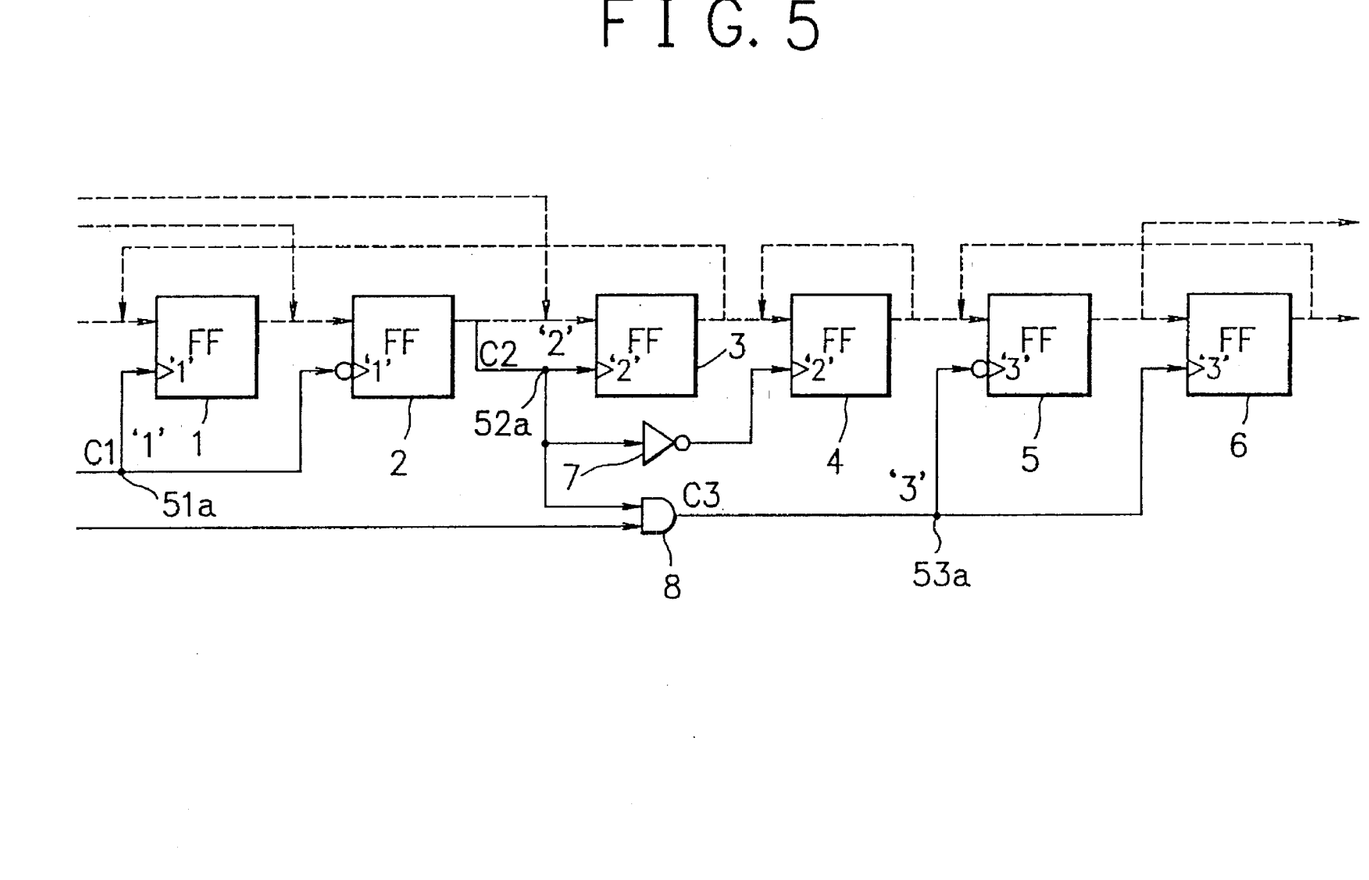
FIG. 5 is a circuit diagram of the object circuit of FIG. 2, as it is processed so that a number of FFs are each respectively labelled with an identification number of an associated clock source.

Concurrently, in an order of the pointing, the three clock sources 51a, 52a and 53a are identified, as shown in FIG. 5, by a series of continuous integers '1', '2'and '3' (hereafter, individually "i" and collectively "I") in a one-to-one corresponding manner. Then, the six FFs 1~6 are each labeled with an associated one i of the identification numbers (hereafter "id") I, i.e., the FFs 1 and 2 with the id '1', the FFs 3 and 4 with the id '2', and the FFs 5 and 6 with the id '3'.

Referring again to FIG. 2, the six FFs 1~6 have their data output connections 1a~6a.

The output connection 1a of the FF 1, which is labeled with the id '1', is connected via one sequential data path to a data input terminal of the FF 2, which also is labeled with the id '1'. Thus, for the FF 1, the clock source id i labeled to itself (hereafter "own clock id") is equivalent to that i labeled to any destination FF (i.e. FF 2) of its data output (hereafter "destination clock id").

The output connection 2a of the FF 2 is connected via one sequential data path to a data input terminal of the FF 3, which is labeled with the id '2'. Thus, for the FF 2, the own clock id '1' is different from a destination clock id thereof (i.e. '2').

The output connection 3a of the FF 3 is connected via one sequential data path to a data input terminal of the FF 4, which also is labeled with the id '2', and via one combinational logic path to a data input terminal of the FF 1, which is labeled with the id '1'. Thus, for the FF 3, the own clock id '2' is different from one of destination clock ids thereof (i.e. '1' and '2').

The output connection 4a of the FF 4 is connected via one sequential data path to a data input terminal of the FF 5,
which is labeled with the id '3', and via one combinational logic path to the data input terminal of the FF 4 itself. Thus, for the FF 4, the own clock id '2' is different from one of destination clock ids thereof (i.e. '2' and '3').

The output connection 5a of the FF 5 is connected via one sequential data path to a data input terminal of the FF 6, which also is labeled with the id '3'. Thus, for the FF 5, the own clock id '3' is equivalent to any destination clock id thereof (i.e. '3').

The output connection 6a of the FF 6 is connected via one combinational logic path to the data input terminal of the FF 6, which also is labeled with the id '3'. Thus, for the FF 5, the own clock id '3' is equivalent to any destination clock id thereof (i.e. '3').

Figure 3:
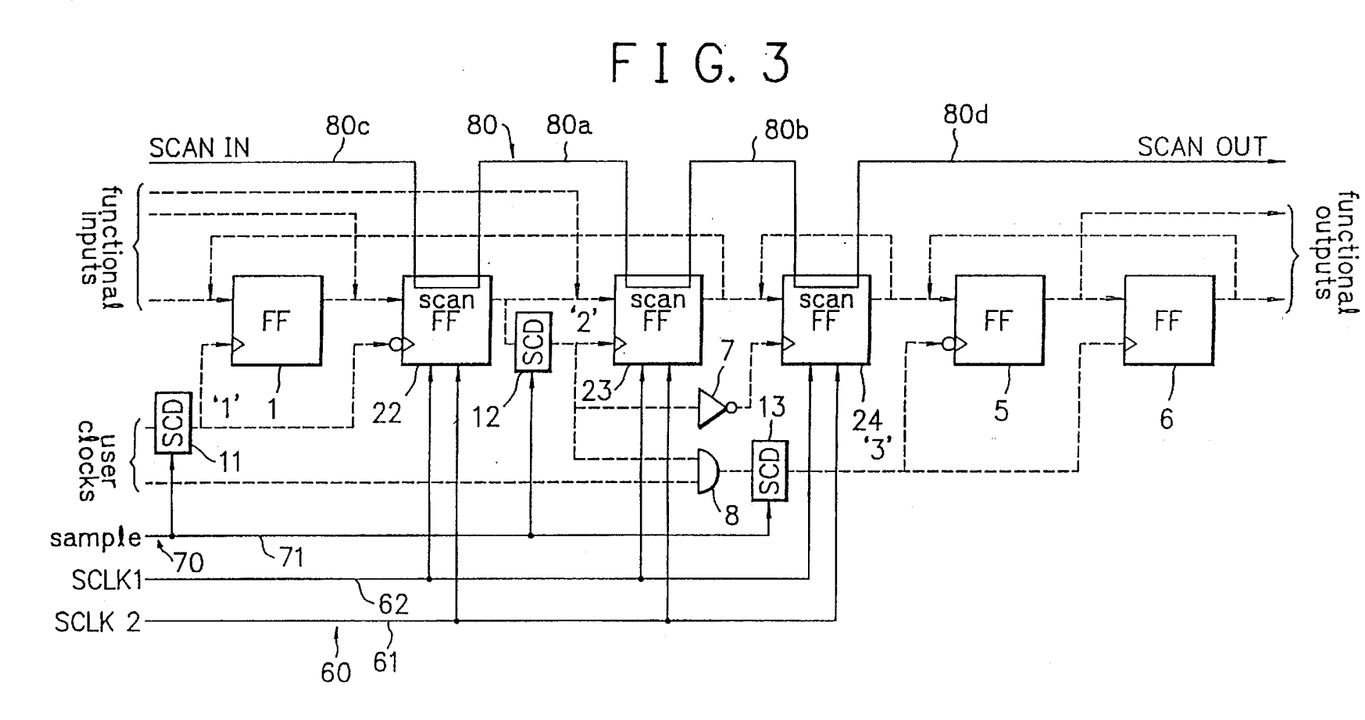
FIG. 3 is a circuit diagram of an essential part of an integrated logic circuit according to an embodiment of the invention, including a partial scan path circuit designed by applying the design method according to the invention to the object circuit of FIG. 2.

Accordingly, in the present embodiment, among the six FFs 1~6, the FFs 2, 8 and 4 are selected to be designed as scan FFs 22, 23 and 24, respectively, as shown in FIG. 3, while the other FFs 1, 5 and 6 are left as they are non-scan FFs.

FIG. 3 shows an essential part of the integrated logic circuit designed by the CAD system, including a partial scan path circuit designed by applying the above-outlined design method to the object circuit of FIG. 2.

The partial circuitry shown in FIG. 3 comprises the object circuit of FIG. 2 excepting the FFs 2, 3 and 4, and scan test circuitry that comprises a scan clock supply circuit 60 for supplying each scan FF 22~24 with a pair of scan clocks SCLK1 and SCLK 2 for scan actions, an operation mode control circuit 70 for controlling a signal state at each clock source '1'~'3' to control an operation mode of each FF, and a scan path 80 as a shift register for responding to the clock source signal state and the scan clocks SCLK1 and SCLK2 to sequentially shift a scan FF test data, a serial pattern of functional test data and a set of functional sample data.

The scan clock supply circuit 60 comprises a supply circuit 61 of the scan clock SCLK1 for a latching action to hold or sample a data, and a supply circuit 62 of the scan clock SCLK2 for a transfer action to output the data.

The operation mode control circuit 70 comprises a supply circuit 71 of a scan sample signal and a plurality of (three in this case) clock controllers (hereafter "SCD") 11, 12 and 13 for responding to the scan sample signal to have a clock signal state (e.g. "1") set at each clock source '1'~'3'.

The scan path 80 comprises the scan FFs 22~24 cascaded by scan test connections 80a and 80b between a scan-in path 80c and a scan-out path 80d.

A partial scan path design method, in which an id comparison check is executed at an input side of each FF in accordance with the invention, will be generally described below along a flow chart of FIG. 4, with reference to FIGS. 2, 3 and 5 to 8.

Figure 4:
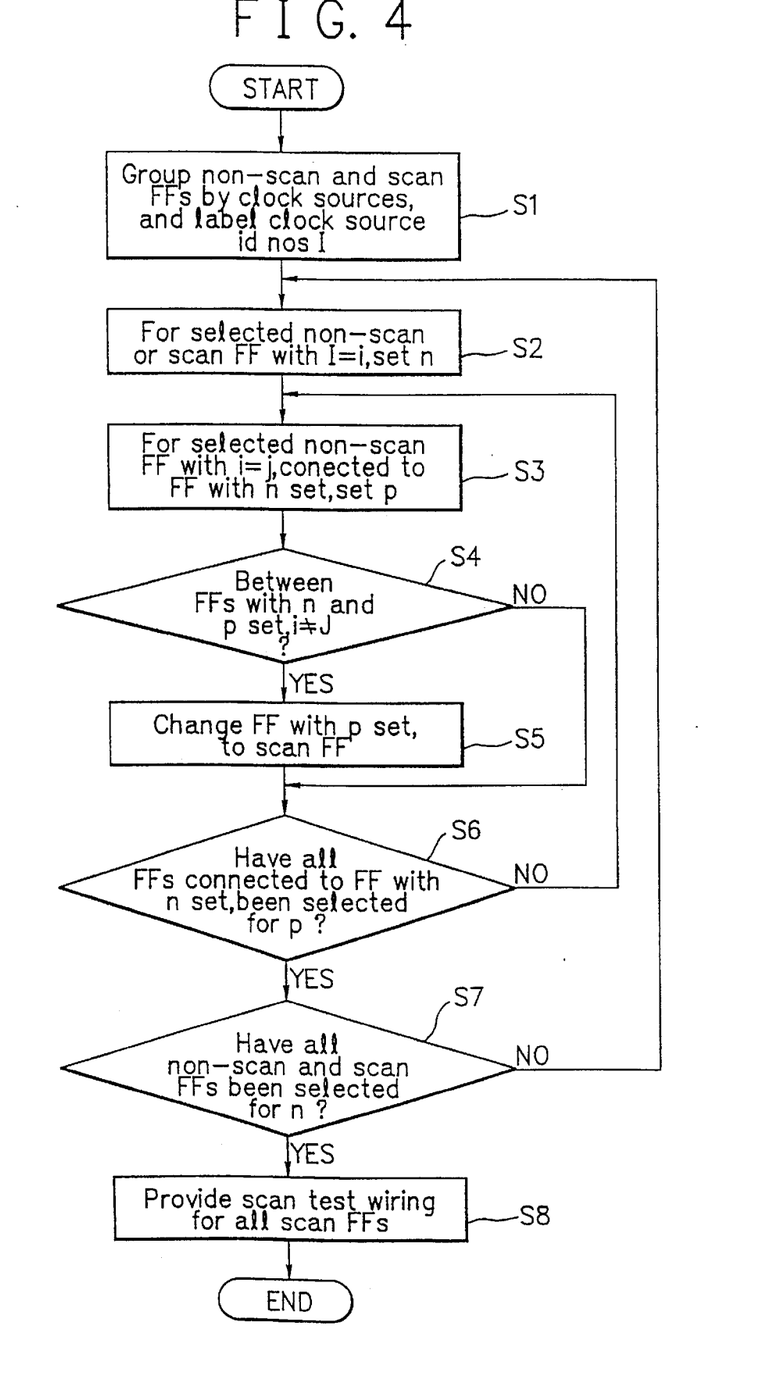
FIG. 4 is a flow chart of the design method according to the invention.

FIG. 4 is a flow chart of the design method. FIGS. 5 to 8 are circuit diagrams of the object circuit of FIG. 2, as it is processed so that in FIG. 5 all FFs are labelled with ids, in FIG. 6 one FF is selected as a scan FF, in FIG. 7 another FF is selected as a scan FF, and in FIG. 8 still another FF is selected as a scan FF.

As shown in FIG. 4, at a first step S1, a number of given FFs (i.e. the non-scan FFs 1~6), which may include one or more scan FFs, are grouped by clock sources (i.e. '1' ~'3'), and are labeled with corresponding clock source ids I.

For any FF, a clock source thereof is defined as a nearest one of collective signal lines connected thereto via a buffer or an inverter. In the case of FIG. 2, therefore, clock sources comprise respective signal lines of clocks C1, C2 and C3 represented by the nodes 51a, 52a and 53a, respectively.

The FFs 1 and 2 are connected to the clock source '1' and hence are labeled with the id '1', as shown in FIG. 5. Likewise, the FFs 3 and 4 connected to the clock source '2' are labeled with the id '2', and the FFs 5 and 6 connected to the clock source '3' are labeled with the id '3'.

At a second step S2, there is selected one non-scan or scan FF labeled with an id i, which FF is identified by an FF identification number n, so that the number n is set therefor.

Then, at a third step S3, among FFs connected to the FF with n set, one non-scan or scan FF labeled with an id j is selected, which FF is identified by an FF identification number p, so that the number p is set therefor.

At a fourth step S4, a decision is made, between the FF with n set and the FF with p set, as to whether or not the ids i and j are different from each other.

If i≠j at the step S4, the FF with p set is selected to be designed as a scan FF, at a fifth step S5, before the flow goes to a sixth step S6.

When i=j at the step S4, the flow goes to the step S6, where another decision is made as to whether or not all FFs connected to the FF with n set have been selected to be checked for i≠j.

If the decision at the step S6 provides a negative result, the flow goes to the step S4 to repeat the check for i≠j on a subsequent one of the FFs connected to the FF with n set.

When the decision at the step S6 is affirmative, the flow goes to a seventh step S7.

At the seventh step S7, another decision is made as to whether or not all FFs have been selected to stand for n.

If the decision at the step S7 provides a negative result, the flow goes to the step S2 to repeat the steps S2 to S7.

When the decision at the step S7 is affirmative, the flow goes to an eighth step S8, where the scan test wiring is provided for all FFs selected to be scan FFs.

The partial scan path design method will be described more specifically.

In the object circuit of FIG. 2, the FF 1 is now selected, with the number n set therefor. Then, the FF 3 connected to the input terminal of the FF 1 is selected, with the number p set therefor.

Figure 6:
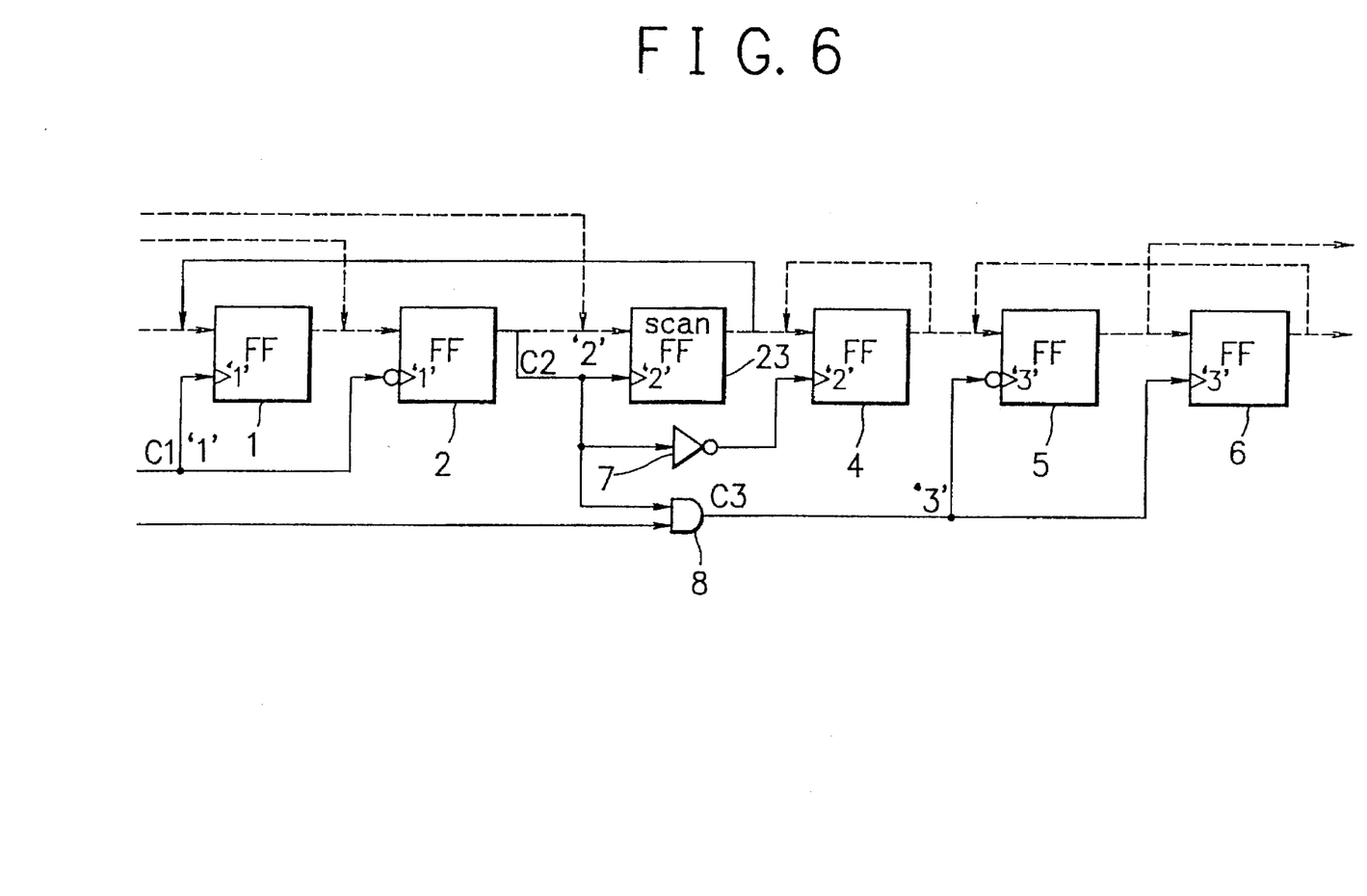
FIG. 6 is a circuit diagram of the object circuit of FIG. 2, as it is further processed so that one FF is determined to be a scan FF.

An id comparison is performed between the FF 1 labeled with the id '1' and the FF 3 labeled with the id '2', with a result that their ids are different from each other, so that a decision is made to have the FF 3 selected to be replaced by the scan FF 23, as shown in FIG. 6.

Then, the FF 2 is selected, with n set therefor, and the FF 1 connected to the input terminal of the FF 2 is selected, with p set therefor.

An id comparison between the FF 2 labeled with the id '1' and the FF 1 labeled with the id '1' leads to a decision result such that their ids equal each other, so that the FF 1 is left without replacement to a scan FF.

Then, the FF 3 is selected, with n set therefor, and the FF 2 connected to the input terminal of the FF 3 is selected, with p set therefor.

Figure 7:
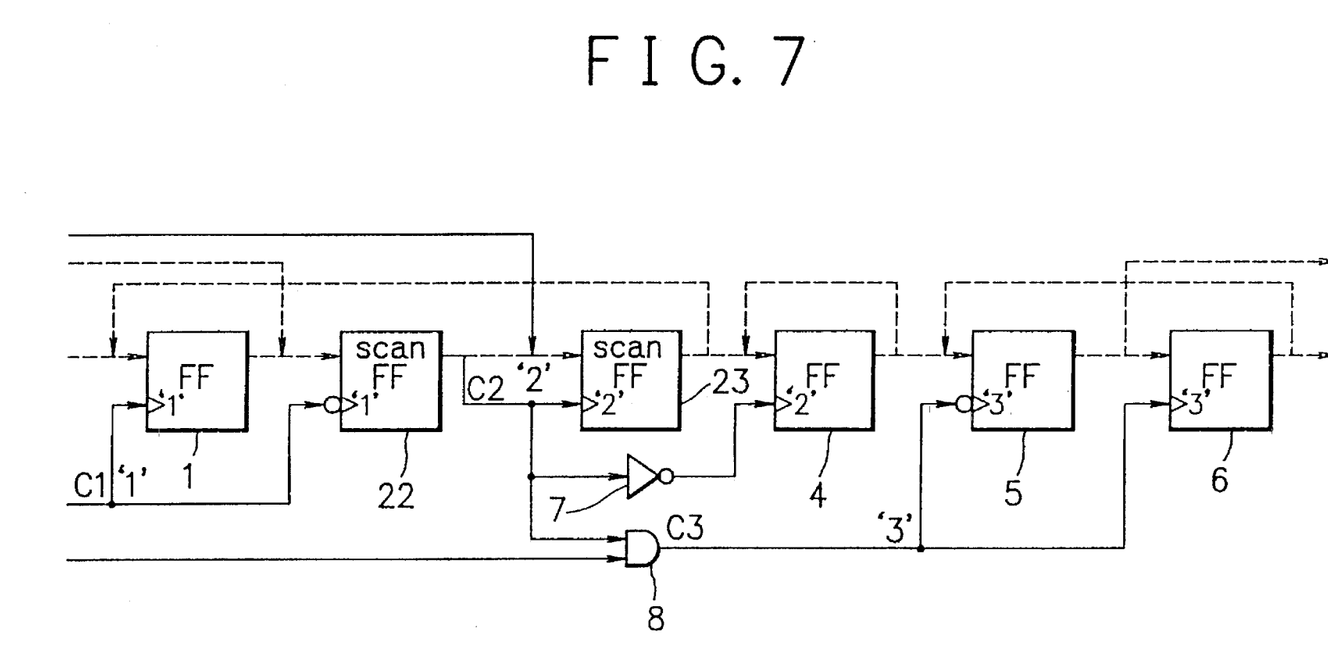
FIG. 7 is a circuit diagram of the object circuit of FIG. 2, as it is still further processed so that another FF is determined to be a scan FF.

An id comparison between the FF 3 labeled with the id '2' and the FF 2 labeled with the id '1' leads to a decision result such that their ids are different from each other, so that the FF 2 is selected to be replaced by the scan FF 22, as shown in FIG. 7.

Then, the FF 4 is selected, with n set therefor, and the FF 4 as a single non-scan FF of which an output is connected to the input terminal of the FF 4 is again selected, with p set therefor.

In this case, the id should be equal as a matter of course, so that the FF 4 is left as it is a non-scan FF.

To this point, the scan FF 23 connected to the FF 4 is not a non-scan FF and hence does not need an id comparison therebetween.

Then, the FF 5 is selected, with n set therefor, and the FF 4 connected to the input terminal of the FF 5 is selected, with p set therefor.

Figure 8:
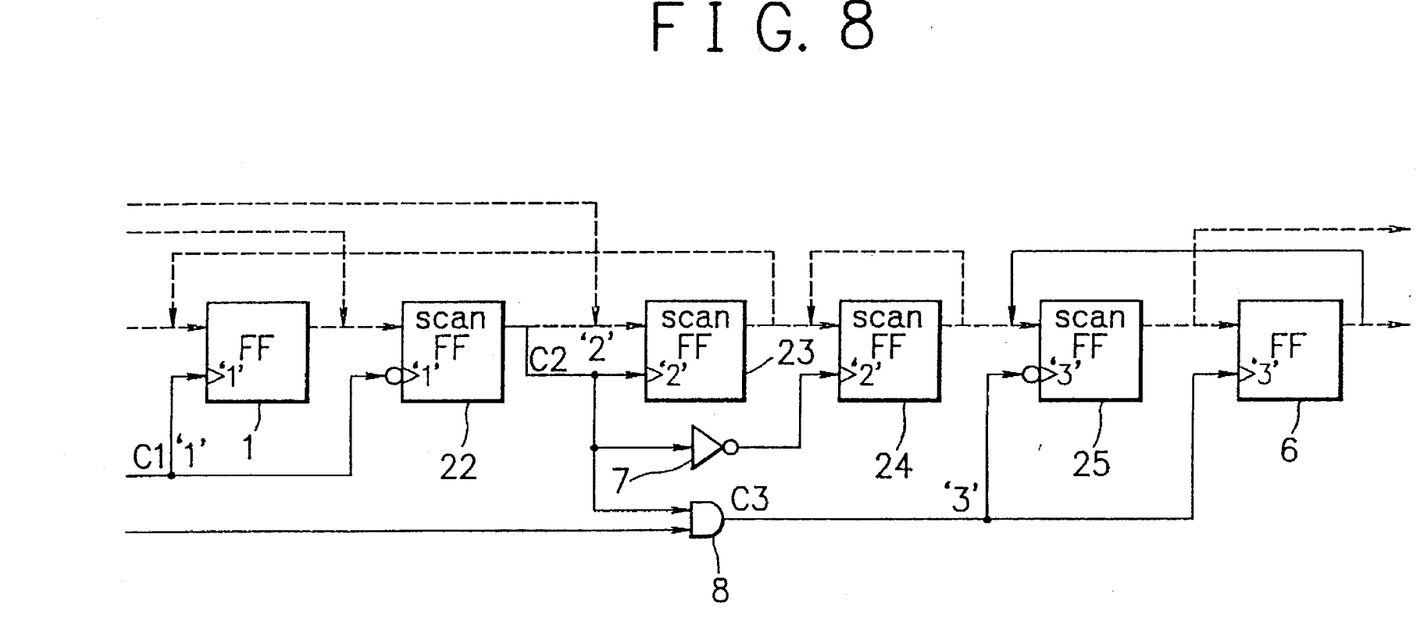
FIG. 8 is a circuit diagram of the object circuit of FIG. 2, as it is yet further processed so that still another FF is determined to be a scan FF.

An id comparison between the FF 5 labeled with the id '3' and the FF 4 labeled with the id '2' leads to a decision such that their ids are different from each other, so that the FF 4 is replaced by the scan FF 24, as shown in FIG. 8.

To this point, also the FF 6 connected to the input terminal of the FF 5 is to be selected, with p set therefor. However, their ids are equal to each other, so that the FF 6 is left as a non-scan FF.

Then, the FF 6 is selected, with n set therefor, and the FF 5 connected to the input terminal of the FF 6 is selected, with p set therefor.

An id comparison between the FF 6 labeled with the id '3' and the FF 5 labeled with the id '3' leads to a decision result such that their ids equal each other, so that the FF 5 is left without replacement to a scan FF.

Now, the six FFs 1~6 have been all selected for n. Thus, as shown in FIG. 3, the scan test wiring will be provided, including the scan test connections 80a and 80b between the scan-in path 80c and the scan-out path 80d, as well as the scan clock supply circuit 60 and the operation mode control circuit 70.

The object circuit of FIG. 2 does not include any scan FF, while the partial scan path design method according to the invention is applicable to an object circuit including one or more existing scan FFs.

Figure 9:
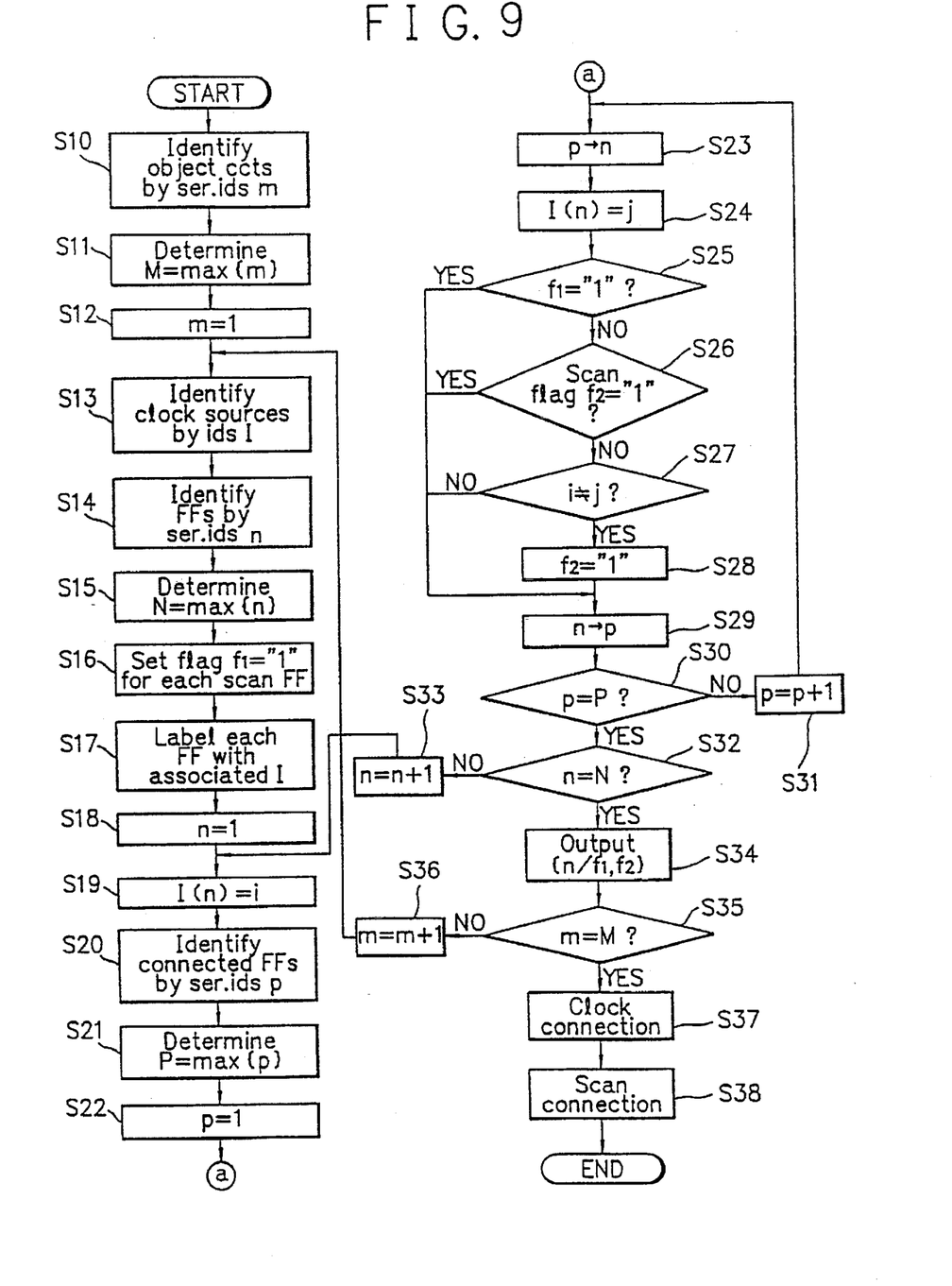
FIG. 9 is a flow chart of a detailed example of the design method of FIG. 4.

FIG. 9 is a flow chart of a detailed example of the design method of FIG. 4, which covers an application to an integrated logic circuit composed of a plurality of object circuits that may each respectively include one or more existing scan FFs.

This example will be described below.

First, at a step S10, the object circuits in the integrated logic circuit are identified by a series of one-to-one correspondent continuous integers as a set of object circuit identification numbers {m}.

Then, at a step S11, a maximum element M of the set {m} is determined to be held as a number corresponding to a total number of the object circuits.

At a subsequent step S12, an initial setting of the id m is executed so that e.g. m=1.

Then, at a step S13, in an object circuit with a current id m, respective clock sources are identified by a series of one-to-one correspondent continuous integers as a set I of clock source identification numbers {i}.

Then, at a step S14, in the object circuit with the current id m, respective (non-scan and scan) FFs are identified by a series of one-to-one correspondent continuous integers as a set of FF identification numbers {n}.

Then, at a step S15, a maximum element N of the set {n} is determined to be held as a number corresponding to a total number of the FFs.

Then, at a step S16, a scan flag f1 is set so that f1 ="1" for each existing scan Then, at a step S17, each FF is labeled with an associated clock source id I.

Then, at a step S18, an initial setting of the id n is executed so that e.g. n=1.

Then, at a step S19, for an FF with a current id n, the clock source id is read, so that I(n)=i.

Then, at a step S20, for the FF with the current id n, respective FFs connected at output ends thereof to the FF with the id n are identified by a series of one-to-one correspondent continuous integers as a set of opponent FF identification numbers {p}.

Then, at a step S21, for the current id n, a maximum element P of the set {p} is determined to be held as a number corresponding to a total number of the connected FFs.

Then, at a step S22, an initial setting of the id p is executed so that e.g. p=1.

Then, at a step S23, a current id p is converted to a corresponding id n.

Then, at a step S24, for an FF with the corresponding id n, the clock source id is read, so that I(n)=j.

Then, at a step S25, a decision is made as to whether or not the scan flag f1 of the FF with the corresponding id n equals "1".

When the f1="1", the flow goes to a step S29.

If f1≠"1" at the step S25, the flow goes to a subsequent step S26.

At the step S26, another decision is made as to whether or not a later-described scan flag f2 of the FF with the corresponding id n equals "1".

When the f2="1", the flow goes to the step S29.

If f2≠"1" at the step S26, the flow goes to a subsequent step S27.

At the step S27, still another decision is made as to whether or not the clock source ids i and j are different from each other.

If i=j at the step S27, the flow goes to the step S29.

When i≠j at the step S27, the flow goes to a subsequent step S28.

At the step S28, the scan flag f2 is set to "1" for the FF with the corresponding id n, as this FF should be designed as a scan FF.

Then, at the step S29, the corresponding id n is converted to the current id p.

Then, at a step S30, a decision is made as to whether or not the current id p equals the maximum number P.

If the p≠P, the flow goes through a step S31, where the current id p is incremented so that p=p+1, to the step S23.

When p=P at the step S30, the flow goes to a subsequent step S32.

At the step S32, another decision is made as to whether or not the current id n equals the maximum number N.

If the n≠N, the flow goes through a step S33, where the current id n is incremented so that n=n+1, to the step S19.

When n=N at the step S32, the flow goes to a subsequent step S34.

At the step S34, data on the scan flags f1 and f2 of the FF with the current id n are output to be stored in a memory.

Then, at a step S35, a decision is made as to whether or not the current id m equals the maximum number M.

If the m≠M, the flow goes through a step S36, where the current id m is incremented so that m=m+1, to the step S13.

When m=M at the step S35, the flow goes to a subsequent step S37.

At the step S37, scan clock connections are provided together with mode control circuits, as necessary.

Then, at a step S38, scan test connections are provided, as necessary.

Figure 10:
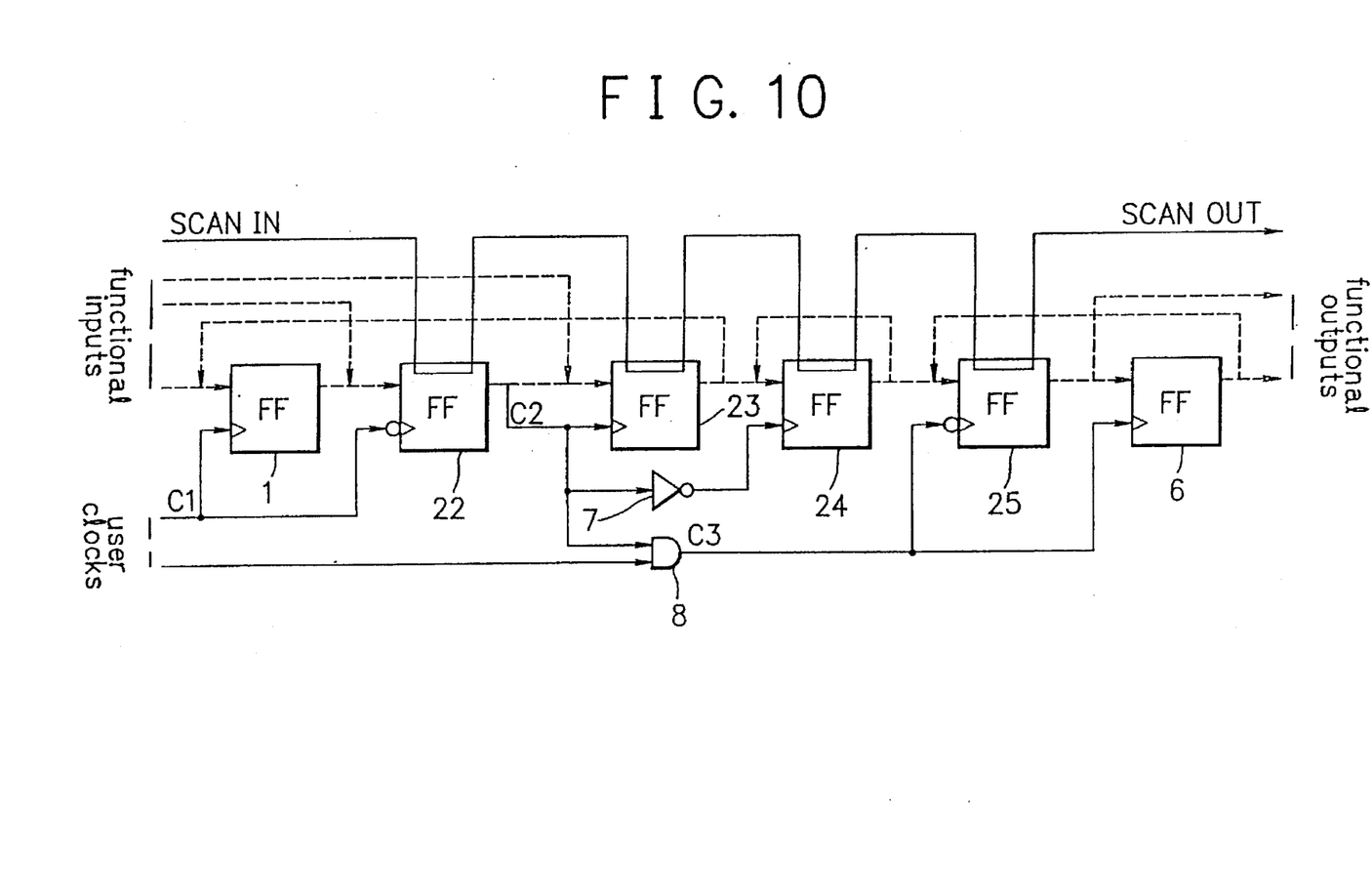
FIG. 10 is a circuit diagram of an essential part of an integrated logic circuit including a partial scan path circuit designed by applying a partial scan path design method according to an embodiment of the invention to the partial circuitry of FIG. 1, as an object circuit before a provision of a scan test wiring.

The design method of FIG. 5 is exemplarily applied to the partial circuitry of FIG. 1 as an object circuit including the existing scan FFs 23 and 25 so that, as shown in FIG. 10, the non-scan FFs 2 and 4 are replaced by scan FFs 24 and 25, respectively.

As will be seen from the foregoing description, a partial scan path circuit designed in accordance with the invention accompanies no data transfer between non-scan FFs with clock source ids different from each other, thus permitting an application to a scan test of a circuit including a multi-clock system or a gated clock system.

It will also be understood that a partial scan path design method according to the invention may be combined with hardware techniques such as for coping with data transfer between scan FFs with clock source ids different from each other or between non-scan and scan FFs with clock source ids different from each other, to achieve an increased effect.

Figure 11:
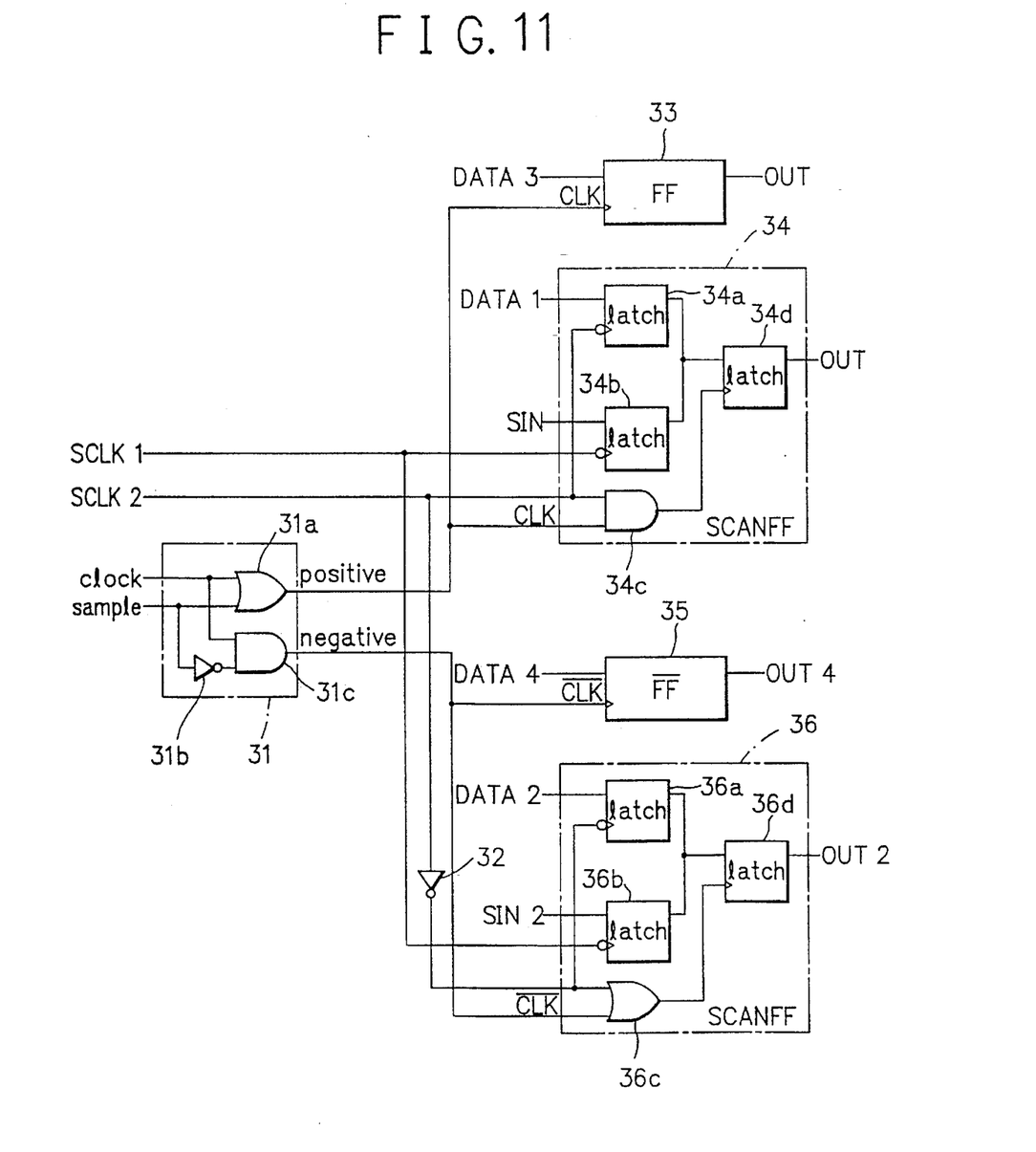
FIG. 11 is a detailed circuit diagram of and around a pair of scan FFs in a partial scan path circuit of an integrated logic circuit according to an embodiment of the invention.
Figure 12:
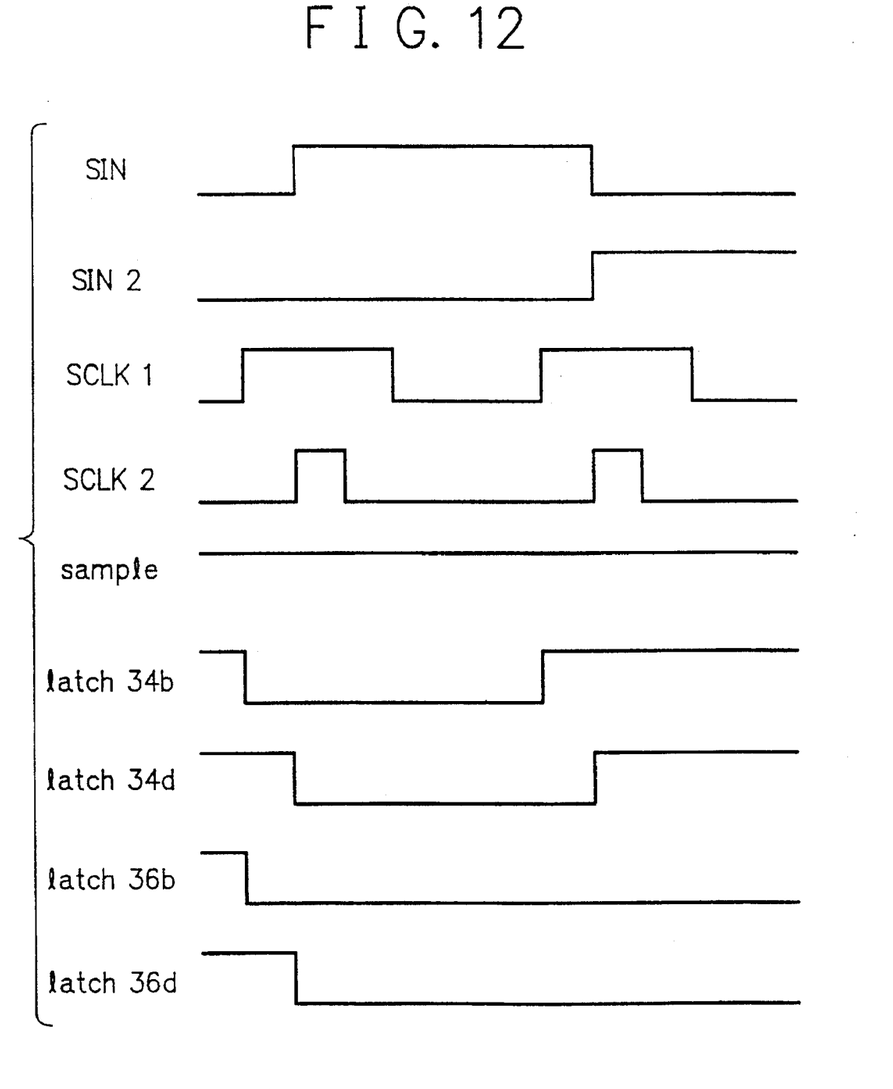
FIGS. 12 and 13 are exemplary time charts of various signals and data associated with the partial scan path circuit of FIG. 11.
Figure 13:
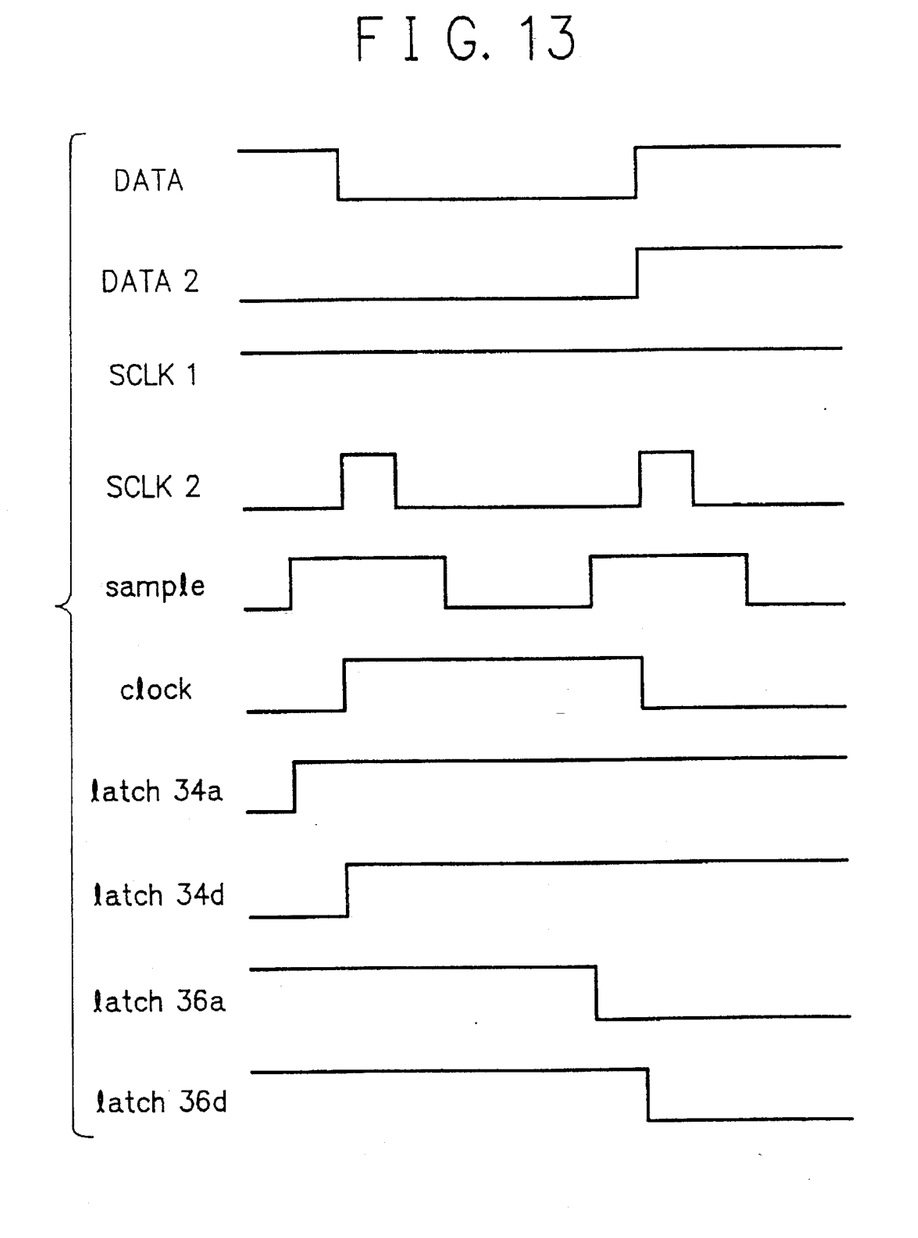

FIG. 11 is a circuit diagram of and around a pair of scan FFs in a partial scan path circuit of an integrated logic circuit according to an embodiment of the invention, and FIGS. 12 and 13 are exemplary time charts of various signals and data associated with the circuit of FIG. 11.

In FIG. 11, designated at reference characters 34 and 36 are scan FFs, respectively, 33 and 35 are non-scan FFs, respectively, and 31 and 32 are SCD (user clock controller) and a scan clock inverter, respectively.

The SCD 31 comprises an OR gate 31a, an inverter 31b and an AND gate 31c.

The scan FF 34 comprises a combination of three latch circuits 34a, 34b and 34d, and an AND gate 34c.

The scan FF 36 comprises a combination of three latch circuits 36a, 36b and 36d, and an AND gate 36c.

The scan FFs 34 and 36 have a similar function to the FFs in the adapted flip-flop circuit for FLT described in the section of the Description of the Related Art, subject to a latch action at a front stage of each FF, which is caused by a front edge of a scan clock pulse in the conventional circuit, and a clock-out action at a rear stage of each FF, which is caused by a rear edge of the scan clock pulse in the conventional circuit.

However, in the circuit of FIG. 11 which uses a typical CMOS technique difficult a clock-out action by a rear edge of a clock pulse, there are employed a pair of scan clocks SCLK1 and SCLK2 so that a latch action is caused by a front edge of a pulse of the scan clock SCLK1 and a clock-out action is caused by a front edge of a pulse of the scan clock SCLK2, as well as other considerations for the application to a multi-clock and a gated clock.

The scan FF 34 is operative with a positive-logic clock, and the scan FF 36 with a negative-logic clock, whereas the non-scan FF 33 is operative with a positive-logic clock, and the non-scan FF 35 with a negative-logic clock.

Thus, the scan FF 34 as well as the non-scan FF 33 has a clock terminal CLK thereof connected to a positive-logic clock terminal of the SCD 31, and the scan FF 36 as well as the non-scan FF 35 has a clock terminal CLK⁻ (i.e. CLK with overhead bar) thereof connected to a negative-logic clock terminal of the SCD 31.

The scan FFs 34 and 36 have scan input terminals SIN and SIN2 thereof connected to an unshown output terminal of an unshown scan FF or an unshown external terminal.

The scan FFs 34 and 36 and the non-scan FFs 33 and 35 may not be all needed to be present in the circuit shown in FIG. 11. In the case of an absence of the scan FF 36 and the non-scan FF 35, the SCD 31 may preferably exclude the inverter 31b, the AND gate 31c and the negative-logic clock terminal thereof. In the case of an absence of the scan FF 34 and the non-scan FF 33, the SCD 31 may preferably exclude the OR gate 31a and the positive-logic clock terminal thereof.

The SCD 31, which is connected to a single pair of scan FFs 34 and 36 and a single pair of non-scan FFs 33 and 35 in FIG. 11, may preferably be connected to a plurality of pairs of scan FFs and a plurality of pairs of non-scan FFs.

Functions of the circuit of FIG. 11 will be described below.

First, the scan clocks SCLK1 and SCLK2 are used to operate the scan FFs as a shift register, so that a test pattern is set in the scan FFs.

For the scan FF 84, a scan sample signal is set to a predetermined level "1" and the scan clock SCLK1 is caused to rise to thereby set in the latch circuit 34b a data from the scan input terminal SIN, and the scan clock SCLK2 is caused to rise to thereby transfer the data to the latch circuit 34d, to be output through an output terminal OUT.

Likewise, for the scan FF 36, the scan clock SCLK1 is caused to rise to thereby set in the latch circuit 36b a data from the scan input terminal SIN2, and the scan clock SCLK2 is caused to rise to thereby transfer the data to the latch circuit 36d, to be output through an output terminal OUT2.

During such actions, the scan sample signal is fixed to level "1", whereby a user clock has its value broken. Hence, the user clock is permitted to have an arbitrary constitution that a multi-clock or a gated clock may have. Therefore, even in use of such an advanced clock, a partial scan path circuit may serve for an adequate shifting guaranteed by such a function.

Moreover, during such actions, also the clocks supplied to the non-scan FFs 33 and 35 are fixed, thus effectively holding data as they are latched before a shifting thereof, so that the FFs 33 and 35 are kept free from influences due to the shifting, permitting an associated test to be facilitated.

After such actions, the scan FFs have data set therein as results of an operation of a combinational logic and actions of the non-scan FFs.

In this operation, in a case the user clock is "0", the scan clock SCLK1 is kept at the level "1" and the scan sample signal is caused to rise to thereby set a value of data DATA 1 in the latch circuit 34a, and the scan clock SCLK2 is caused to rise to thereby set the data value in the latch circuit 34d, while the scan FF 36 is disabled.

On the other hand, in a case the user clock is "1", the scan clock SCLK1 is kept at the level "1" and the scan sample signal is caused to rise to thereby set a value of data DATA 2 in the latch circuit 36a, and the scan clock SCLK2 is caused to rise to thereby set the data value in the latch circuit 36d, while the scan FF 34 is disabled.

In such cases, therefore, operational results have a dependency on a state of the user clock, permitting a fault of the user clock to be concurrently detected.

After such an operation, latched data in the scan FFs are serially read to be compared with an expected reference pattern. Then, the foregoing steps will be repeated, as many times as necessary for testing the integrated logic circuit.

Therefore, according to the invention, a series of steps such as shown in FIG. 4 are followed to eliminate a data transfer between non-scan FFs different of a clock source id from each other, and a partial scan path circuit such as shown in FIG. 8 is designed to be free from drawbacks due to such a data transfer.

Thus, according to the invention, an integrated logic circuit is effectively adapted for a partial scan in a multi-clock system or a gated clock system resulting in a decreased chip area.

While the present invention has been described with reference to the particular illustrative embodiments, it is not to be restricted by those, embodiments but only by the appended claims. It is to be appreciated that those skilled in the art can change or modify the embodiments without departing from the scope and spirit of the present invention.

What is claimed is:

1. An integrated logic circuit comprising a plurality of flip-flops operative with a plurality of clock signals and permitting partial scan testing, said plurality of flip-flops including:

a plurality of scan flip-flops for said partial scan testing, which are selected such that the flip-flops connected to the output of each of said scan flip-flops include at least one flip-flop which uses a clock different from that of said each of said scan flip-flops; and two scan clock supply means for supplying two scan clocks to each of said scan flip-flops.

2. An integrated logic circuit according to claim 6, further comprising a plurality of gate means, controlled by a scan sample signal supplied commonly thereto from outside of the circuit, each of said plurality of gate means for gating a signal delivered one of directly and via one of an inverter or a buffer to the clock inputs of the flip-flops which use one of said signal and the inverted or buffered version of said signal.

3. An integrated logic circuit according to claim 2, wherein each of said gate means comprises means, responsive to a predetermined value of said scan sample signal associated with a scan operation of said scan flip-flops, for setting the outputs of said gate means for respective predetermined fixed levels.

4. A partial scan path design method for an integrated logic circuit including at least a combinational logic and a plurality of flip-flops coupled therewith and supplied with a plurality of clock signals, the partial scan path design method including a step of:

selecting such flip-flops that the flip-flops connected to the output of each of said flip-flops selected include at least one flip-flop which uses a clock different from that of said each of said flip-flops selected.

5. A partial scan path design method according to claim 4, further including a step of providing each group of flip-flops which have their inputs coupled to one of a signal and an inverted or buffered version of said signal with a gating means controlled by a scan sample signal supplied thereto from outside of said integrated logic circuit for gating a signal delivered one of directly and via an inverter or buffer to the clock inputs of said flip-flops of said group.

6. A partial scan path design method according to claim 4, further including a step of serially connecting the flip-flops selected.

7. A partial scan path design method according to claim 6, further including a step supplying a scan clock to the flip-flops selected.

8. A partial scan path design method according to claim 4, wherein said plurality of clock signals provided to said circuit comprise at least one of multi-phase clocks and gated clocks.

9. An integrated logic circuit according to claim 1, wherein said plurality of clock signals provided to said circuit comprise at least one of multi-phase clocks and gated clocks.

* * * * *